(12) United States Patent
Rahim et al.

(10) Patent No.: US 7,800,402 B1
(45) Date of Patent: Sep. 21, 2010

(54) LOOK-UP TABLE OVERDRIVE CIRCUITS

(75) Inventors: Irfan Rahim, San Jose, CA (US); Sriram Muthukumar, San Jose, CA (US); William Bradley Vest, San Jose, CA (US); Myron Wai Wong, Fremont, CA (US)

(73) Assignee: Altera Corporation, San Jose, CA (US)

( * ) Notice: Subject to any disclaimer, the term of this patent is extended or adjusted under 35 U.S.C. 154(b) by 46 days.

(21) Appl. No.: 11/982,865

(22) Filed: Nov. 5, 2007

(51) Int. Cl.
*H03K 19/173* (2006.01)
*G06F 7/38* (2006.01)

(52) U.S. Cl. ............................. 326/38; 326/41; 326/81; 326/113

(58) Field of Classification Search ............. 326/38–47, 326/113, 63, 68, 81; 365/154, 226
See application file for complete search history.

(56) References Cited

U.S. PATENT DOCUMENTS

| | | | |
|---|---|---|---|
| 4,481,627 A | 11/1984 | Beauchesne et al. | |
| 4,518,875 A | 5/1985 | Aytac | |
| 4,771,192 A * | 9/1988 | Jackson | 327/178 |
| 6,185,126 B1 * | 2/2001 | Rodgers et al. | 365/154 |
| 6,624,771 B2 | 9/2003 | Bal | |
| 6,829,194 B2 * | 12/2004 | Honda et al. | 365/226 |
| 6,992,946 B2 * | 1/2006 | Ooishi | 365/226 |
| 7,053,654 B1 * | 5/2006 | Young et al. | 326/44 |
| 7,075,333 B1 | 7/2006 | Chaudhary et al. | |
| 7,202,697 B1 | 4/2007 | Kondapalli et al. | |
| 7,218,143 B1 | 5/2007 | Young | |
| 7,368,946 B1 * | 5/2008 | Rahman et al. | 326/46 |
| 7,400,167 B2 * | 7/2008 | Lewis et al. | 326/38 |
| 7,592,832 B2 * | 9/2009 | Perisetty | 326/37 |

\* cited by examiner

*Primary Examiner*—Vibol Tan
*Assistant Examiner*—Crystal L Hammond
(74) *Attorney, Agent, or Firm*—Treyz Law Group; G. Victor Treyz; David C. Kellogg

(57) ABSTRACT

A programmable logic device integrated circuit or other integrated circuit may have logic circuitry that produces data signals. The data signals may be routed to other logic circuits through interconnects. The interconnects may be programmable. A level recovery circuit may be used at the end of each interconnect line to strengthen the transmitted data signal. The level recovery circuit that is attached to a given interconnect line may produce true and complementary versions of the data signal that is on that interconnect line. Level shifting circuitry may be provided to boost the data signals on the interconnects. Each interconnect line may have a level shifter circuit that receives the true and complementary versions of a data signal and that produces corresponding boosted true and complementary versions of the data signal. The boosted signals may be provided to the control inputs of complementary-metal-oxide-semiconductor transistor pass gates in programmable look-up table circuitry.

18 Claims, 8 Drawing Sheets

LOOK-UP TABLE OVERDRIVE CIRCUITS

BACKGROUND

This invention relates to integrated circuits, and more particularly, to integrated circuits such as programmable logic devices having look-up tables with overdriven inputs.

Programmable logic devices are a type of integrated circuit that can be programmed by a user to implement a desired custom logic function. In a typical scenario, a logic designer uses computer-aided design tools to design a custom logic circuit. When the design process is complete, the tools generate configuration data. The configuration data is loaded into a programmable logic device to configure the device to perform the functions of the custom logic circuit.

Programmable logic devices contain programmable elements into which configuration data is loaded. The programmable elements may be based on random-access-memory (RAM) cells. Once loaded with configuration data, the RAM cells provide static control signals that are applied to the gates of metal-oxide-semiconductor transistors in blocks of programmable logic. The control signals turn the transistors on and off and thereby configure the programmable logic to implement desired custom logic circuits. RAM-based programmable elements that are loaded with configuration data are sometimes referred to as configuration RAM (CRAM).

Programmable logic devices may contain relatively large blocks of circuitry that are sometimes referred to a logic array blocks. Each logic array block may contain smaller logic regions that are sometimes referred to as logic elements (LEs). Logic elements may be based on combinatorial and sequential logic. As an example, logic elements may contain look-up tables. Each look-up table may have an associated set of CRAM cells. For example, a two-input look-up table may have four associated CRAM cells. Each of the four CRAM cells may be loaded with data. The states of the two inputs to the look-up table determine which of the four CRAM cells is connected to the output of the look-up table. In this way, the two input signals control which of the four data bits in the CRAM cells is "looked up" and routed to the look-up table output.

Routing resources are used to interconnect logic on a programmable logic device integrated circuit. For example, horizontal and vertical conductive lines are used to route signals between logic array blocks. Horizontal and vertical conductive lines may also be used to route signals between logic elements within a logic array block.

The routing fabric of a programmable logic device integrated circuit is typically configurable. For example, there may be programmable routing circuitry such as multiplexer circuitry at the intersection of vertical and horizontal routing lines. The routing circuitry can be controlled by the contents of associated CRAM cells.

As advances in semiconductor fabrication technology are made, logic circuit switching speeds tend to increase. This can allow integrated circuits such as programmable logic device integrated circuits to operate faster. However, increased clock frequencies and transistor switching speeds tend to place a burden on the routing resources and logic of a device. At high speeds, it can be difficult to drive signals through the routing resources of a device. It can also be difficult to operate logic circuits such as look-up tables as rapidly as possible.

It would therefore be desirable to be able to provide integrated circuits such as programmable logic device integrated circuits with improved routing and look-up table circuitry.

SUMMARY

In accordance with the present invention, level shifting circuitry is provided to boost the control inputs to logic circuits such as look-up tables. The boosted inputs help turn on pass gates in the look-up tables more fully than would otherwise be possible, thereby speeding up switching speeds in the look-up table and enhancing device performance.

In a typical arrangement, a programmable logic device integrated circuit or other integrated circuit has logic circuitry that produces data signals. The logic circuitry may include logic elements or other circuits that produce data on one or more output lines. The logic circuitry may be powered using a core logic power supply voltage, so that the data signals have an unboosted voltage level (e.g., the core logic power supply voltage).

The output lines from the logic circuitry may be connected to interconnect paths. The interconnect paths may include one or more conductive interconnect lines. Programmable circuitry such as pass transistors that are controlled by associated programmable elements may be provided in the interconnect paths.

A level recovery circuit may be used at the end of each interconnect line to strengthen the transmitted data signal. The level recovery circuit that is attached to a given interconnect line may produce true and complementary versions of the unboosted data signal that is on that interconnect line. Each level recovery circuit may have an inverter that inverts the data signal from an associated interconnect line. Each level recovery circuit may also have a p-channel metal-oxide-semiconductor transistor that is connected in series between a positive power supply terminal (e.g., a terminal that is maintained at the core logic power supply voltage) and the associated interconnect line. The gate of the p-channel metal-oxide-semiconductor transistor may be connected to the output of the inverter. When the voltage on the interconnect line rises, the output of the inverter falls, thereby turning on the p-channel transistor. This strengthens the data signal by pulling the voltage on the interconnect line high towards the positive power supply voltage.

Level shifting circuitry may be provided to boost the data signals on the interconnects. Each interconnect line may have a level shifter circuit that receives the true and complementary versions of the strengthened but unboosted data signal associated with a given data recovery circuit. The level shifting circuitry may boost the true version of the data signal to a higher voltage to produce a corresponding boosted version of the true data signal. The level shifting circuitry may also boost the complementary version of the data signal to provide a complementary boosted data signal.

The outputs of the level shifting circuitry may therefore include both a boosted data signal and an inverted version of the boosted data signal. These boosted data signals may be provided to the control inputs of complementary-metal-oxide-semiconductor (CMOS) pass gates.

The complementary metal-oxide-semiconductor pass gates may each include an n-channel metal-oxide-semiconductor transistor and a p-channel metal-oxide-semiconductor transistor. The boosted data signal from the level shifting circuit may be applied to the gate of one or more of the n-channel metal-oxide-semiconductor pass gate transistors. The inverted version of the boosted data signal may be applied to the gate of one or more of the p-channel metal-oxide-semiconductor pass gate transistors.

The complementary metal-oxide-semiconductor pass gates may be used to implement multiplexing circuitry within a look-up table. The look-up table may have associated programmable elements that are loaded with configuration data to provide look-up table entries for the look-up table. Level shifter circuits may be used to reduce the voltage of signals that are produced by the programmable elements in the look-up tables. The level-shifted programmable element output signals may be provided to the CMOS pass gates in the look-up table.

Further features of the invention, its nature and various advantages will be more apparent from the accompanying drawings and the following detailed description.

DETAILED DESCRIPTION

The present invention relates to integrated circuits with circuitry for driving logic circuits such as look-up tables. The integrated circuits on which the logic circuits and drive circuitry are formed may be integrated circuits such as programmable logic device integrated circuits. This is, however, merely illustrative. The logic circuits and drive circuitry may be formed on integrated circuits such as digital signal processors, microprocessors, custom integrated circuits, or other integrated circuits. The present invention is sometimes described in the context of programmable logic device integrated circuits as an example.

Programmable logic device integrated circuits can be customized using configuration data. In a typical scenario, a logic designer uses a computer-aided design (CAD) system in designing a desired logic circuit. The computer-aided design system uses information on the hardware capabilities of a programmable logic device to generate configuration data.

Programmable logic devices contain programmable elements. The programmable elements may be based on any suitable programmable technology such as fuses, antifuses, laser-programmed elements, electrically-programmed elements, non-volatile memory elements, volatile memory elements, mask-programmed elements, etc. In a typical scenario, the programmable elements are based on random-access memory (RAM) cells.

To customize programmable logic devices to implement the desired logic circuit, the configuration data produced by the computer-aided design system is loaded into the programmable elements. Programmable elements that are based on RAM cells are sometimes referred to as configuration random-access memory (CRAM) cells. Because CRAM cells are widely used in programmable logic devices, the memory elements in programmable logic devices are sometimes referred to herein as CRAM cells.

During operation of a programmable logic device, each programmable element provides a static output signal based on its loaded configuration data. The output signals from the programmable elements are applied to the gates of metal-oxide-semiconductor transistors in regions of programmable logic on the programmable logic device. This configures the programmable logic so that the programmable logic device implements the desired logic circuit.

Figure 1:
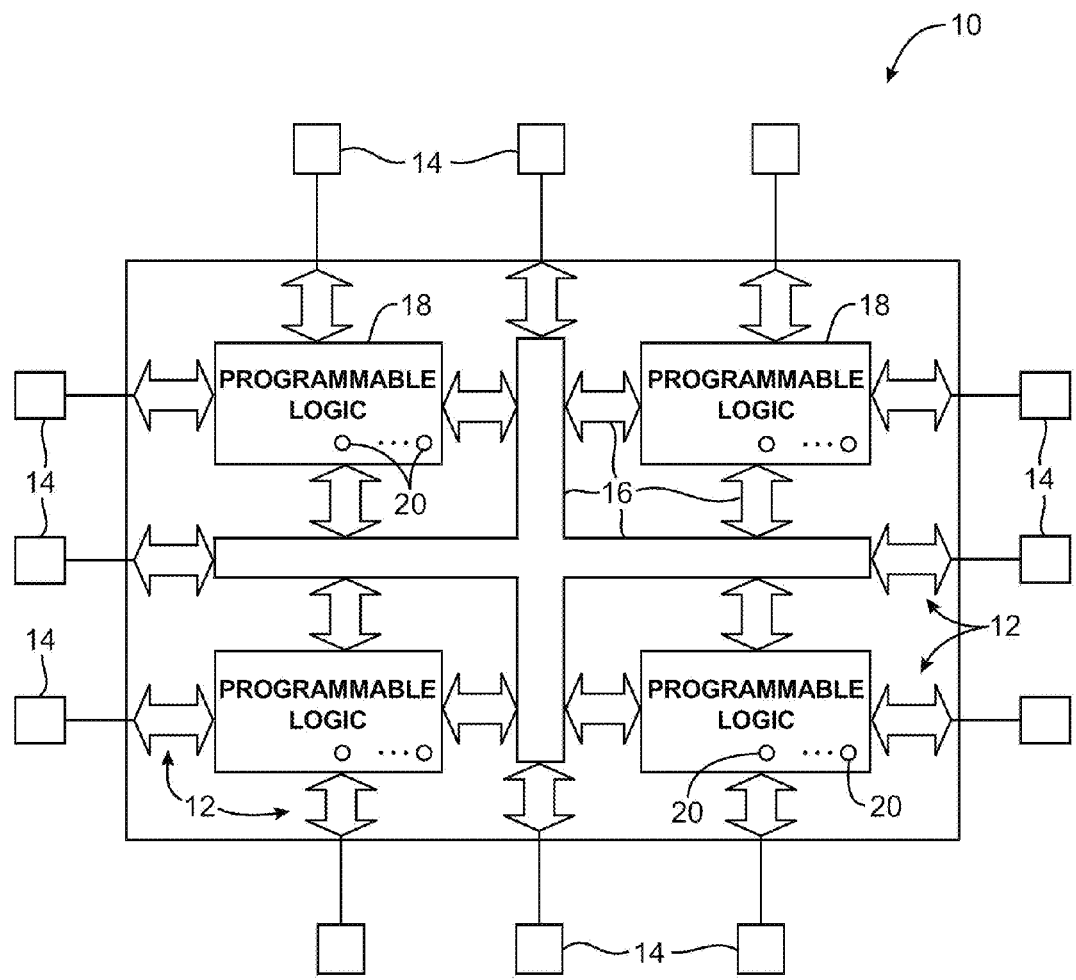
FIG. 1 is a diagram of an illustrative integrated circuit such as a programmable logic device integrated circuit in accordance with an embodiment of the present invention.

An illustrative programmable logic device 10 in accordance with the present invention is shown in FIG. 1. Programmable logic device 10 has input-output circuitry 12 for driving signals off of device 10 and for receiving signals from other devices via input-output pins 14. Interconnection resources 16 such as global and local vertical and horizontal conductive lines and buses are used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources 16 may be considered to be a type of programmable logic.

The programmable elements 20 in logic 18 may be loaded from any suitable source. In a typical arrangement, the programmable elements are loaded from an external erasable-programmable read-only memory and control chip called a configuration device via pins 14 and input-output circuitry 12.

The circuitry of device 10 may be organized using any suitable architecture. As an example, the logic of programmable logic device 10 may be organized in a series of rows and columns of larger programmable logic regions each of which contains multiple smaller logic regions. Larger regions of programmable logic may sometimes be referred to as logic array blocks (LABs). Smaller logic regions that are contained within the larger regions may sometimes be referred to as logic elements (LEs). Logic elements may contain combinational logic such as look-up table logic and sequential logic (e.g., registers).

The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

As semiconductor fabrication processing techniques advance, it is becoming possible to produce integrated circuits with smaller features that operate at reduced power supply voltages. For example, metal-oxide-semiconductor transistors can be produced that are scaled down in size from previous generations and that have smaller threshold voltages Vt. Power consumption can be reduced by reducing the power supply voltage Vcc that is used on newer circuits.

Programmable logic device integrated circuits and other integrated circuits are often fabricated using metal-oxide-semiconductor (MOS) transistors. To reduce power consumption, it is desirable to reduce the size of the currents flowing through the MOS transistors. This can be accomplished by reducing the magnitude of the positive power supply voltage Vcc that is used on the integrated circuit.

Data signals on an integrated circuit may vary between a logic low value of Vss (e.g., a ground voltage of 0 volts) and a logic high value of Vcc (i.e., a core logic positive power supply voltage). When Vcc is reduced, the amount of current Id that flows through various MOS transistors on the integrated circuit can be reduced.

Consider, as an example, an n-channel metal-oxide-semiconductor (NMOS) pass transistor that is located within the programmable interconnects 16 of device 10. When a voltage Vss is applied to the gate of this transistor, the transistor will be turned off, so that no data will be able to pass through the transistor. When a voltage Vcc is applied to the gate of the transistor, the transistor will be turned on and data will be able to flow. In a programmable logic device, pass transistors can be configured in this way by applying static control signals from associated CRAM cells based on loaded configuration data.

As device geometries shrink, there is a desire to scale Vcc to lower voltages to reduce power consumption and to ensure that the smaller devices are not overwhelmed by excessive voltages. However, it is generally not possible to reduce Vt as much as Vcc. When an MOS transistor is operated in its subthreshold region, its leakage current Id rises exponentially with increases of gate voltage and reductions in threshold voltage Vt. Integrated circuit designs in which the transistor threshold voltage Vt is reduced by the same amount as the positive supply voltage Vcc may therefore exhibit unacceptable levels of static power consumption.

To ensure that pass transistors and other MOS transistors on an integrated circuit do not exhibit unacceptable levels of leakage current, voltage scaling tends to be implemented unequally. As an example, Vcc might be reduced from 1.1 volts to 0.9 volts with successive generations of a circuit design, whereas the threshold voltage Vt might only be reduced from 0.4 volts to 0.3 volts.

Because it is not generally possible to scale Vcc and Vt proportionally due to leakage current considerations, Vcc levels are generally dropping more rapidly than Vt levels. When a transistor has a voltage Vcc on its gate, its drain current Id will be proportional the square of the difference between gate voltage Vcc and the transistor's threshold voltage Vt. Because Vcc levels are generally being reduced less than Vt levels, the maximum drain current Id that a given transistor can produce is falling. Falling Id levels, in turn, make it difficult to drive signals onto interconnect lines and elsewhere on an integrated circuit. For example, reduced Id levels may limit pass gate performance in interconnects, because reduced Id levels make it difficult to charge the parasitic capacitance associated with interconnect conductors.

Figure 2:
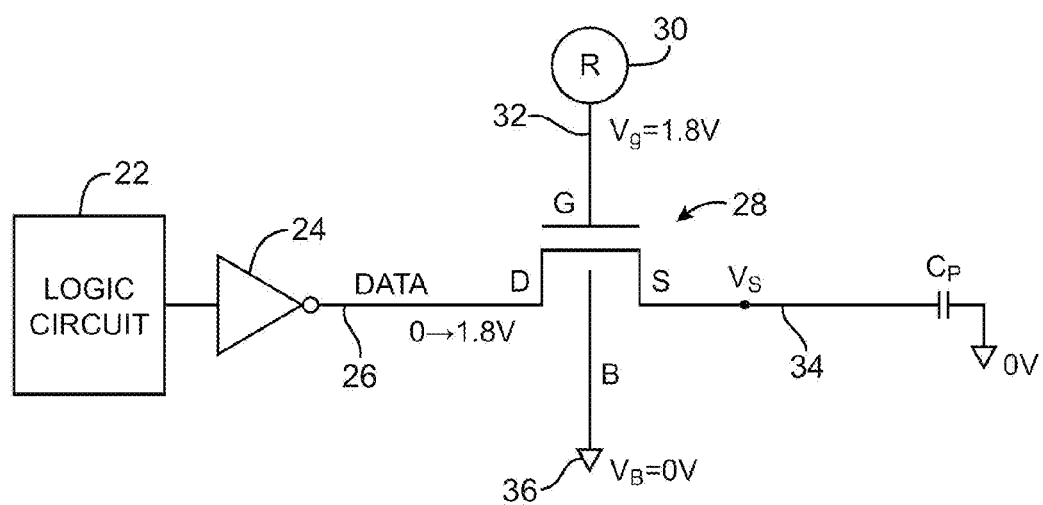
FIG. 2 is a circuit diagram of a conventional programmable logic device integrated circuit routing line with a pass gate.

A conventional programmable logic device integrated circuit pass gate circuit that is susceptible to this type of problem is shown in FIG. 2. As shown in FIG. 2, a logic circuit 22 may have an output buffer 24. Circuit 22 and buffer 24 may be used to transmit data signals DATA on an interconnect line. The interconnect line may have a first portion 26 and a second portion 34. A programmable multiplexer or other programmable interconnect circuit may be used to selectively route signals within interconnects on an integrated circuit. The programmable multiplexer may have an associated pass gate, such as pass gate 28 of FIG. 2.

Pass gate 28 of FIG. 2 is implemented using an n-channel metal-oxide-semiconductor (NMOS) transistor having a drain terminal D, a source terminal S, a gate terminal G, and a body terminal B. Body terminal B may be biased to 0 volts at ground terminal 36. The voltage on gate G may be determined by the state of a configuration data bit that is stored in CRAM cell 30. In the example of FIG. 2, a logic one has been stored in CRAM cell 30, so CRAM cell 30 is producing a positive output voltage on control line 32.

In the conventional arrangement of FIG. 2, output drivers such as driver 24 and CRAM cells such as cell 30 are powered at a positive power supply voltage Vcc of 1.8 volts. As a result, the signal DATA on line 26 varies between a logic low level of 0 volts and a logic high level of 1.8 volts and the output of CRAM cell 30 is 1.8 volts.

This type of configuration, in which the gate voltage Vg on gate G of transistor 28 is equal to the maximum voltage level associated with the DATA signal, can lead to relatively slow switching performance.

Figure 3:
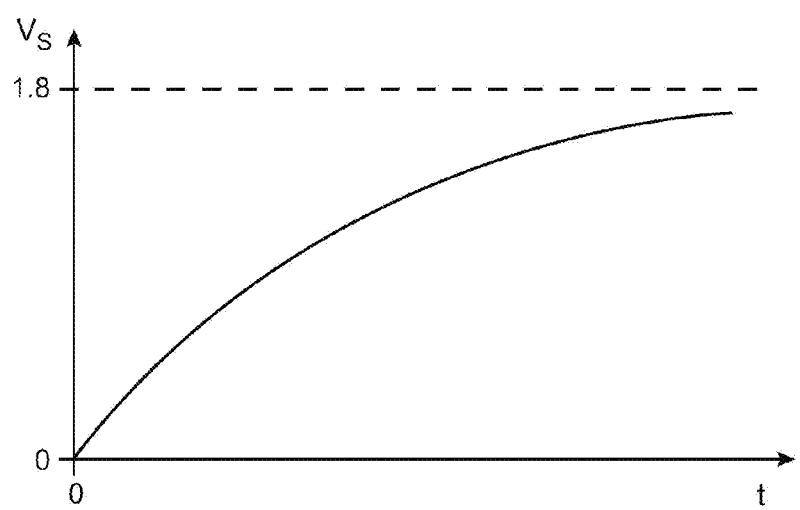
FIG. 3 is a graph showing how the signal voltage at the output of a programmable logic device integrated circuit pass gate may vary as a function of time when the input to the pass gate is provided with a rising logic signal.

The output voltage Vs on line 34 of the circuit of FIG. 2 when transistor 28 is biased as shown in FIG. 2 and is presented with a rising data signal is shown in FIG. 3. At times before t=0, the voltage on input line 26 and output line 34 is 0 volts. At time t=0, the signal DATA on line 26 transitions from 0 volts to 1.8 volts. There is a non-zero parasitic capacitance Cp that is associated with interconnect lines such as line 34, so the voltage Vs on line 34 does not change instantaneously. Rather, the voltage Vs changes from 0 volts to 1.8 volts as shown in FIG. 3.

Initially, switching is fairly rapid. However, as the data signal DATA begins to propagate through pass transistor 28, voltage Vs on line 34 rises towards 1.8 volts and the voltage Vgs between gate G and source S of transistor 28 (FIG. 2) tends to decrease. This causes the drain current Id of transistor 28 to fall. The effective value of the threshold voltage Vt of transistor 28 also tends to increase because Vt is influenced by the value of the source-to-body voltage Vsb. Because Vs is rising, the value of Vsb also rises, causing an increase in Vt. This increase in Vt also tends to decrease the drain current Id of transistor 28. Due to these influences, the switching speed of pass gate 28 tends to slow as the voltage Vs rises, leading to a relatively long switching "tail" in the switching characteristic shown in FIG. 3.

Figure 4:
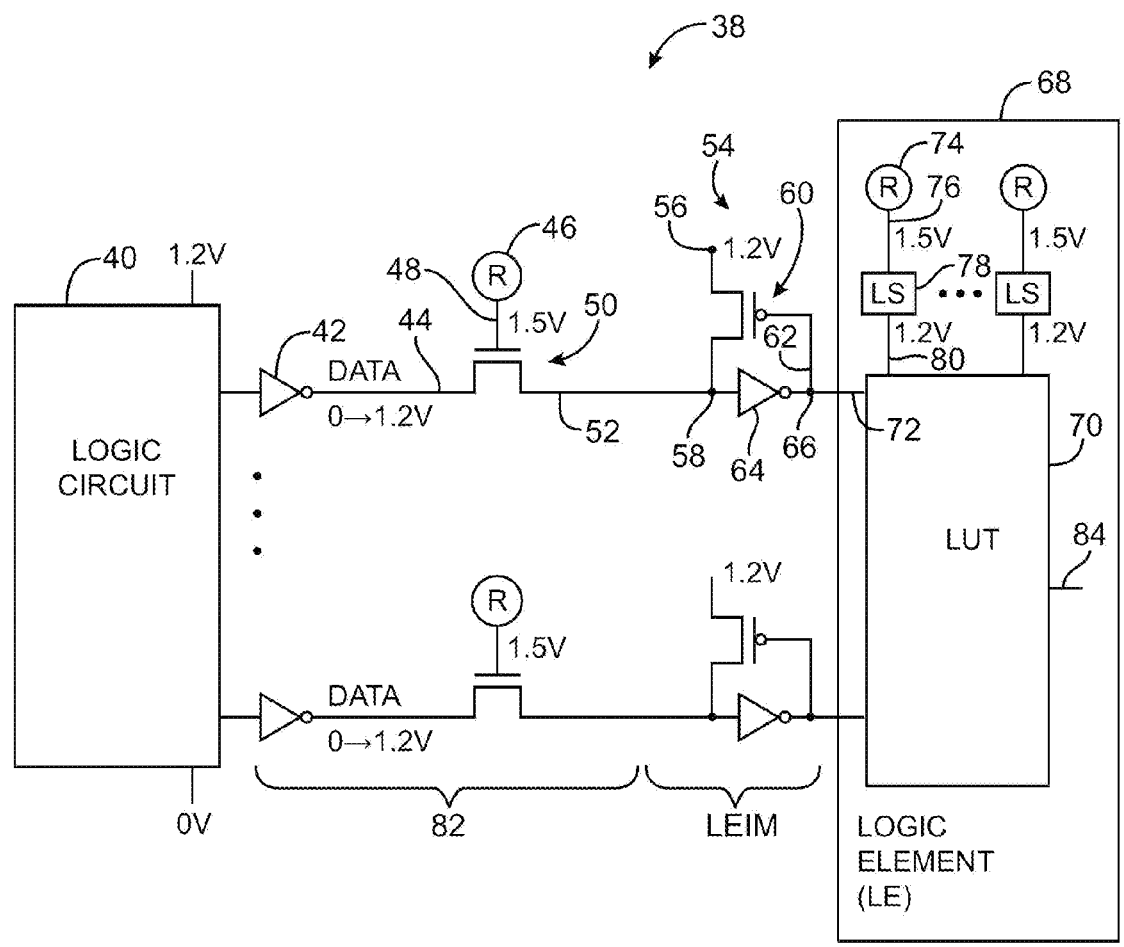
FIG. 4 is a diagram of a conventional programmable logic device integrated circuit in which data signals from a logic circuit are routed through pass gates and interconnect lines to a logic element input matrix and logic element look-up table.

In situations in which long interconnect lines are being driven or when pass gate switching speeds are critical, the conventional interconnect drive arrangement of FIG. 2 may not be acceptable. It may therefore be desirable to bias pass gates such as pass gate 28 with elevated voltages relative to the level of signal DATA. A conventional programmable logic device integrated circuit with this type of pass gate biasing arrangement is shown in FIG. 4. As shown in FIG. 4, programmable logic device integrated circuit 38 may have logic circuitry 40 that generates data signals. Logic circuitry 40 may have output drivers such as inverter 42. Data signals from logic circuit 40 may be driven onto lines such as line 44 as signal DATA. Lines such as line 44, pass gate 50, and lines such as line 52 may be part of the programmable interconnects 82 on programmable logic device integrated circuit 38.

With the conventional arrangement of FIG. 4, logic circuit 40 and output drivers such as inverter 42 are part of the core logic of device 38 and are powered at a positive power supply voltage 1.2 volts and a ground power supply voltage of 0 volts. The signal DATA that is driven onto interconnect line 44 may therefore range between a logic low value of 0 volts and a logic high signal of 1.2 volts.

Pass gate 50 is formed from an NMOS transistor. The gate of the NMOS transistor receives a control signal on line 48 from an associated CRAM cell 46. In order to ensure that pass gate 50 offers a low resistance path to input signal DATA and allows sufficient current to be driven onto line 52, the voltage that is generated by CRAM cell 46 is elevated. In particular, CRAM cell 46 is powered using an elevated positive power supply voltage of 1.5 volts. This 1.5 volt power supply voltage is 0.3 volts higher than the voltage of data signal DATA. Elevating the CRAM power supply and output signal level in this way ensures that transistor 50 will be fully turned on, even as the signal DATA on line 44 rises to 1.2 volts. As a result, the conventional arrangement of FIG. 4 may exhibit better pass gate switching performance than conventional arrangements of the type shown in FIG. 2.

In the conventional arrangement of FIG. 4, the signal DATA is routed over interconnects 82 to a logic element 68. Logic elements such as logic element 68 contain look-up tables such as look-up table 70. On programmable logic device integrated circuits with logic circuits that are organized in logic array blocks containing multiple smaller logic element blocks, the circuitry that serves to drive signals from the interconnects into the logic elements is generally referred to as the logic element input matrix (LEIM). In the conventional arrangement of FIG. 4, the LEIM of device 38 includes level recovery circuits such as level recovery circuit 54.

Each level recovery circuit 54 in the LEIM of the conventional programmable logic device 38 of FIG. 4 has a p-channel metal-oxide-semiconductor (PMOS) transistor 60. The source of transistor 60 is connected to interconnect line 52 at node 58. The drain of transistor 60 is connected to a positive power supply voltage of 1.2 volts at terminal 56. The gate of transistor 60 is connected to node 66 at the output of inverter 64 via path 62. As the signal on line 52 and therefore node 58 rises, the output of inverter 64 falls. This falling voltage is driven onto the gate of PMOS transistor 60 via feedback path 62. As the voltage on the gate of PMOS transistor 60 falls, transistor 60 is turned on. This forms a low resistance path between node 56 and node 58 and pulls node 58 towards the positive power supply voltage of 1.2 volts on node 56. Use of level recovery circuitry in the LEIM of conventional programmable logic device integrated circuits helps to strengthen the input signals to logic elements such as logic element 68.

Each logic element 68 includes a look-up table 70. The look-up table 70 receives data signal DATA (i.e., an inverted version of DATA) via input lines such as input line 72. The entries in look-up table 70 are established by the values of the configuration data bits that are loaded into associated CRAM cells 74. Each loaded CRAM cell 74 produces either a static logic low signal (i.e., a 0 volt signal) or a static logic high signal (i.e., a 1.5 volt signal). Level shifters such as level shifter 78 are used to reduce the elevated power supply voltage level of 1.5 volts at the outputs of CRAM cells 74 to the core logic power supply voltage level of 1.2 volts. The level shifted CRAM output signals are applied to look-up table 70 via associated paths such as path 80.

During operation of device 38, logic circuits such as logic circuit 40 generate patterns of data signals DATA on their associated output lines. These data signals are routed to the inputs of other logic circuits. These logic circuits include logic elements such as logic element 68. Each logic element receives input data signals DATA on inputs such as input line 72 and produces a corresponding output on an associated look-up table output such as output 84. The value of the signal on output 84 is determined by the states of the DATA input signals to look-up table 70 and on the states of the look-up table entries stored in CRAM cells 74.

Figure 5:
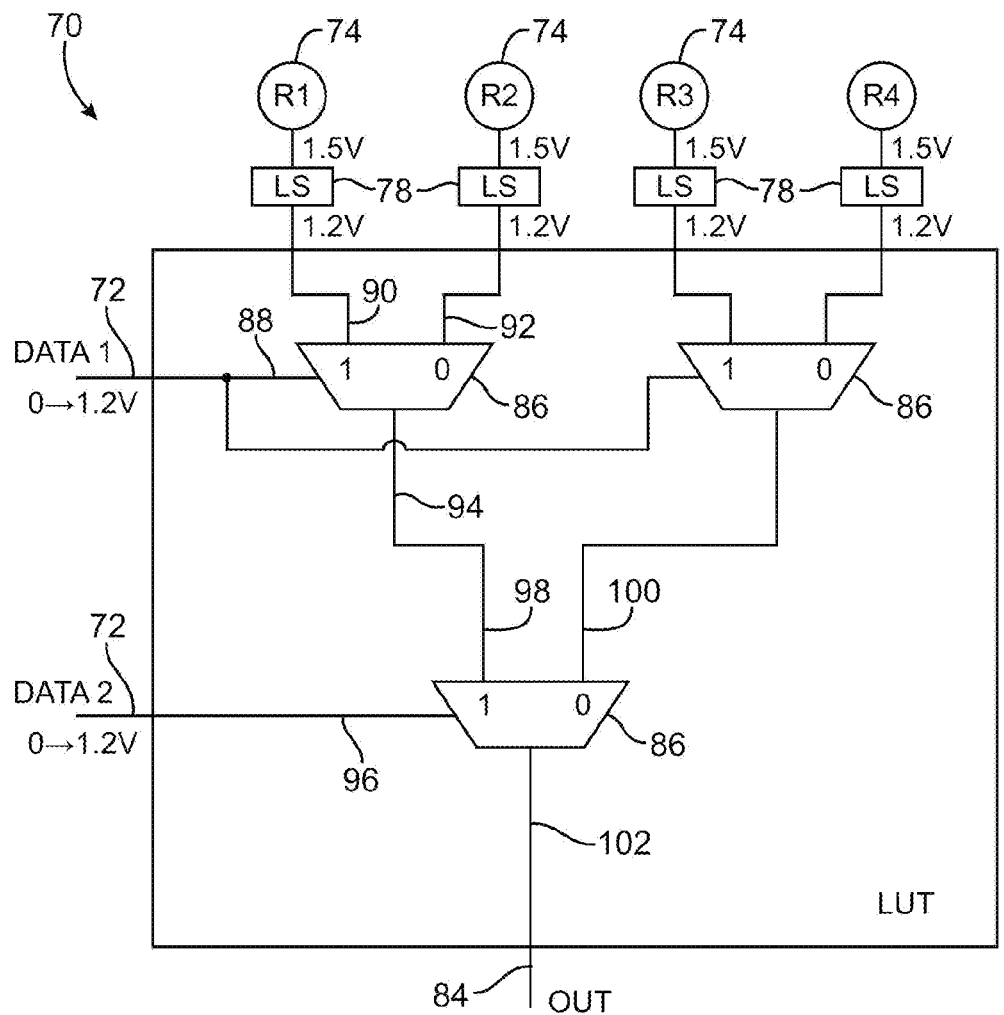
FIG. 5 is a circuit diagram of a conventional programmable logic device integrated circuit look-up table having two inputs and four associated look-up table entries.

A typical look-up table circuit 70 is shown in FIG. 5. In the simplified example of FIG. 5, look-up table 70 has two data inputs 72, which carry respective logic element input data signals DATA1 and DATA2. CRAM cells 74 are loaded with configuration data. Each CRAM cell determines the value of an associated entry in look-up table 70. In the example of FIG. 5, there are four entries in table 70. CRAM cell R1 stores the value of the first entry, CRAM cell R2 stores the value of the second entry, CRAM cell R3 stores the value of the third entry, and CRAM cell R4 stores the value of the fourth entry. Each of these entries may be either a logic one or a logic zero. By selection of various different patterns of look-up table entries, the programmable logic of the programmable logic device may be configured to implement a desired custom logic design.

Level shifters 78 reduce the magnitude of the CRAM cell outputs from 1.5 volts to 1.2 volts. If a given CRAM cell 74 contains a logic zero, its output will be 0 volts and the output of its associated level shifter 78 will be 0 volts. If a given CRAM cell 74 contains a logic one, its output will be 1.5 volts and the output of its associated level shifter 78 will be 1.2 volts.

Look-up table 70 contains switches that selectively route look-up table entries from cells 74 to look-up table output 84. In particular, multiplexers 86 are used to selectively route signals from cells 74 to output 84 in response to control signals on input lines 72. The data input signal DATA1 is routed to two associated multiplexers 86. Each multiplexer may have a control input such as control input 88.

When the signal on control input 88 is high, input 90 is connected to multiplexer output 94 (i.e., to route the look-up table entry from CRAM cell R1 to output 94). When the signal on control input 88 is low, signals on multiplexer input 92 are routed to multiplexer output 94 (i.e., to route the look-up table entry from CRAM cell R2 to output 94).

After passing through one level of multiplexers (i.e., the layer formed by the upper two multiplexers in the FIG. 5 example), the selected CRAM signal (R1, R2, R3, or R4) is passed to another level of multiplexers (i.e., the layer formed by the lower multiplexer 86 in the FIG. 5 example). This lower multiplexer is controlled by the control signal DATA2 that is applied to multiplexer control input 96. When DATA2 is high, the signal on multiplexer input 98 is routed to multiplexer output 102. When DATA2 is low, the signal on multiplexer input 100 is routed to multiplexer output 102. Output 102 is connected to look-up table output OUT (line 84).

Using this type of arrangement, N input data signals DATA can select among $2^N$ look-up table entries stored in $2^N$ CRAM cells 74. A typical value for N is 4 (forming a 4-input look-up table or 4-LUT).

Figure 6:
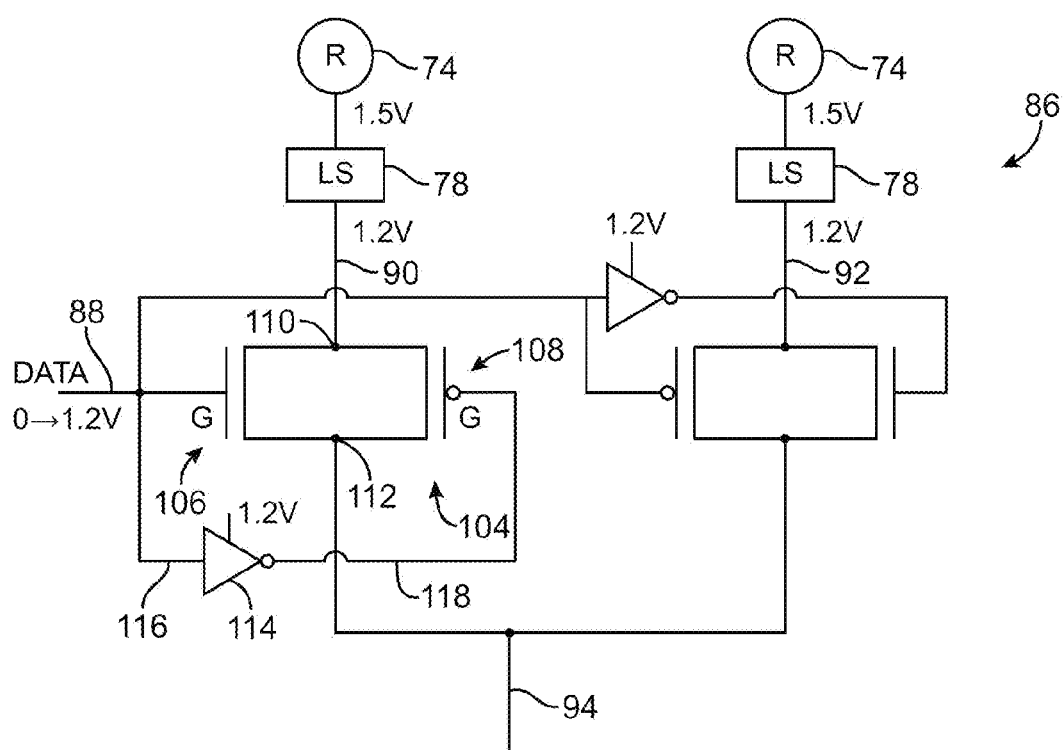
FIG. 6 is a circuit diagram of a conventional complementary metal-oxide-semiconductor (CMOS) transistor pass gate of the type used in programmable logic device integrated circuit look-up tables such as the programmable logic device integrated circuit look-up table of FIG. 5.

To ensure that the signals DATA successfully route the desired look-up table entries to output 84, multiplexers 86 may be formed from complementary metal-oxide-semiconductor (CMOS) pass gates. A 2:1 multiplexer formed from CMOS pass gates is shown in FIG. 6. As shown in FIG. 6, multiplexer 86 has two CMOS pass gates each of which is formed from parallel NMOS and PMOS transistors. The leftmost pass gate (pass gate 104) is formed from NMOS transistor 106 and PMOS transistor 108. Transistors 106 and 108 are connected in parallel between nodes 110 and 112. Node 110 is connected to multiplexer input 90. Node 112 is connected to multiplexer output 94.

The state of CMOS pass gate 104 is controlled by the value of the control signal DATA on input line 88. When DATA is high, the signal on the gate G of NMOS transistor 106 is high and transistor 106 is on. The high signal on line 116 is inverted by inverter 114, so that the signal on line 118 is low. This takes the gate G of PMOS transistor 108 low and turns on transistor 108. With transistors 106 and 108 on, signals can flow between nodes 110 and 112. When DATA is low, the signal on gate G of NMOS transistor 106 is low and the signal on gate G of PMOS transistor 106 is high, turning off transistors 106 and 108 and forming an open circuit between nodes 110 and 112.

The NMOS and PMOS transistors in the pass gates of multiplexer 86 work together to ensure that there is a low resistance path between input 90 and output 94 when DATA on line 88 is high. As described in connection with FIG. 3, the switching behavior of NMOS transistors such as NMOS transistor 106 tends to slow down as the signal that is being routed from its drain to source (i.e., from node 110 to node 112) rises. The presence of PMOS transistor 108 helps to overcome this slowdown in performance. As NMOS transistor 106 begins to switch more slowly at relatively large values of signal on node 110, PMOS transistor 108 starts turning on strongly. This is because the gate voltage Vg on PMOS transistor 108 is near 0 volts, so its gate to source voltage Vgs is less than 0 volts. The use of CMOS pass gates in the look-up tables of programmable logic device integrated circuits therefore helps to improve look-up table speeds.

Despite the use of CMOS pass gates in conventional programmable logic device integrated circuits, programmable logic device look-up table speeds face increased challenges as devices are scaled to lower Vcc and Vt values. Because Vt values tend not to fall as rapidly as Vcc values as devices are scaled, pressure is placed on the switching speeds of both NMOS and PMOS devices. In environments in which both NMOS and PMOS devices switch more slowly than desired, even CMOS pass gates may not switch rapidly enough for certain look-up table applications.

In accordance with an embodiment of the present invention, look-up table input signal boosting circuitry may be used to overcome these problems. The look-up table input signal boosting circuitry may boost the voltage of look-up table input data signals (DATA) such as signals DATA1 and DATA2 in FIG. 5 before these signals are applied to the control inputs of switching circuitry such as look-up table multiplexers. The look-up table multiplexers may, for example, be formed from CMOS pass gates, as described in connection with FIG. 5. In this type of situation, both true and complement versions of the boosted data signals (called BDATA and NBDATA) may be produced and used to control the CMOS pass gates. The control signal boosting circuitry may be incorporated into the logic element input matrix (LEIM) portion of a programmable logic device integrated circuit. With one suitable arrangement, only two additional transistors are used to implement the input signal boosting circuitry for each input data line.

Figure 7:
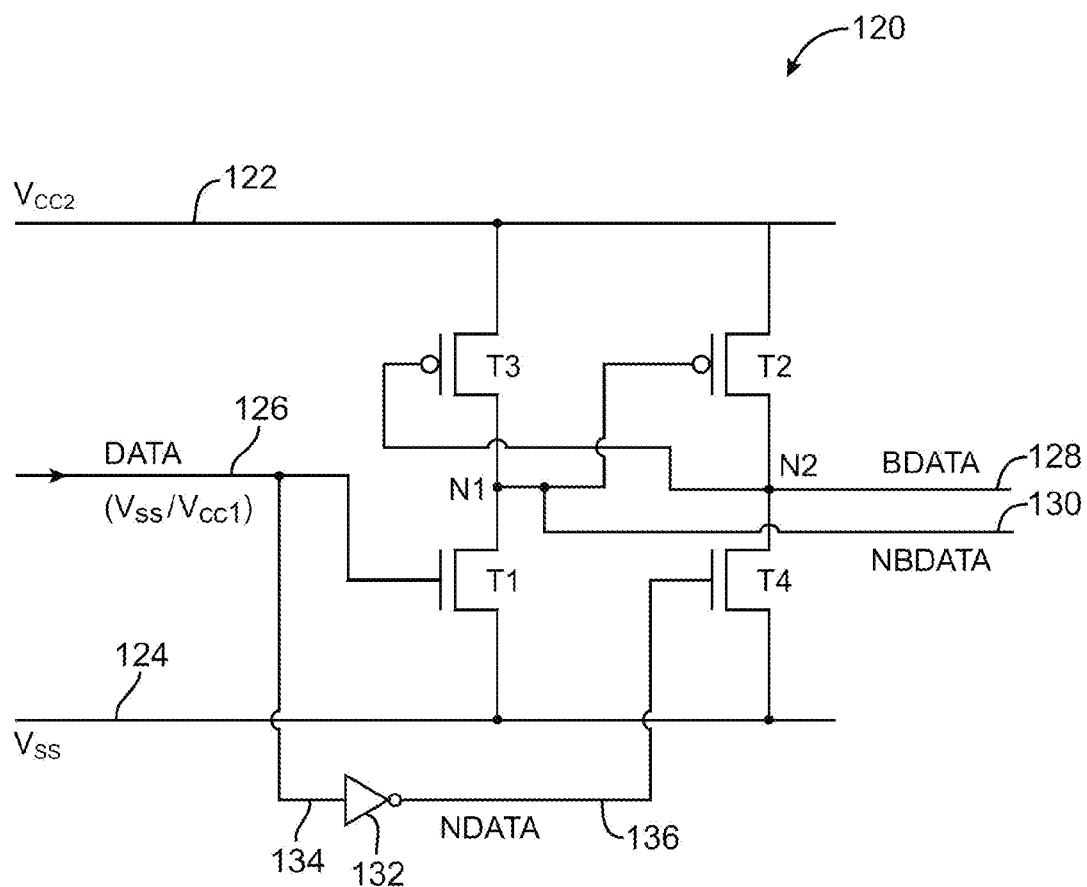
FIG. 7 is a circuit diagram of an illustrative level shifter circuit that may be used to boost look-up table input signals on an integrated circuit such as a programmable logic device integrated circuit in accordance with an embodiment of the present invention.

An illustrative boosting circuit is shown in FIG. 7. Boosting circuit 120, which may sometimes be referred to as a level shifter or level shifting circuit, receives data signal DATA from a logic circuit on input line 126. Boosting circuit 120 may be powered using a ground voltage Vss (e.g., 0 volts) on ground line 124. Boosting circuit 120 may also be powered by an elevated positive power supply voltage Vcc2 on power supply line 122. The data signal DATA may be produced by the output of a logic element (LE) or other suitable logic circuit on an integrated circuit such as programmable logic device integrated circuit 10 of FIG. 1. This logic, which is sometimes referred to as core logic, may be powered using a core logic power supply voltage of Vcc1. As a result, the voltage of data signal DATA on line 126 may vary between Vss (when DATA is at a logic low value) and Vcc1 (when data is at a logic high value).

The value of power supply voltage Vcc2 is preferably elevated with respect to Vcc1 (i.e., Vcc2 is greater than Vcc1). In general, any suitable values may be used for Vcc1 and Vcc2. As an example, the value of Vcc1 may be 0.9 volts and the value of Vcc2 may be 1.5 volts. This is, however, merely illustrative. Any suitable voltage levels may be used for Vcc1 and Vcc2 if desired. The power supply circuitry that supplies voltage Vcc1 (i.e., the core logic power supply voltage) may, as an example, be located off chip. The power supply circuitry that supplies elevated power supply voltage Vcc2 may be external (off-chip) or internal. If desired, Vcc1 may be derived from Vcc2 (e.g., using a voltage divider or other power regulator circuitry).

Circuit 120 receives data signal DATA on line 126 and boosts the signal level of DATA. The corresponding boosted version of DATA is called BDATA and is provided on output line 128. Signal DATA on input line 126 ranges between Vss and Vcc1. Boosted data signal BDATA on output line 128 ranges from Vss to Vcc2. Boosting circuit 120 may have a second output 130 at which an inverted version of boosted signal BDATA is provided. The inverted version of BDATA is called NBDATA. The signals BDATA and NBDATA are complementary. As signal BDATA transitions from Vss to Vcc2 (corresponding to a transition of signal DATA from Vss to Vcc1), signal NBDATA transitions from Vcc2 to Vss. Similarly, as signal BDATA transitions from Vcc2 to Vss (corresponding to a transition of DATA from Vcc1 to Vss), the signal NBDATA transitions from Vss to Vcc2.

Inverter 132 receives input signal DATA on input path 134 and produces a corresponding inverted (complementary) version of DATA called NDATA on path 136. As the signal DATA is provided to the gate of transistor T1, complementary signal NDATA is provided to the gate of transistor T4.

NMOS transistors T1 and T4 and PMOS transistors T2 and T3 turn on and off in response to input data signal DATA, thereby switching signals Vss and Vcc2 to outputs 128 and 130 as appropriate. Consider, as an example, the situation in which data signal DATA transitions from Vss to Vcc1 on input line 126. As DATA goes high on input 126, the gate of NMOS transistor T1 is pulled high, thereby turning on NMOS transistor T1. When NMOS transistor T1 is turned on, the voltage on node N1 is pulled low to voltage Vss on line 124. The voltage on node N1 is applied to the gate of PMOS transistor T2. When N1 is pulled low, PMOS transistor T2 is turned on, pulling node N2 high to Vcc2. When node N2 is pulled high to Vcc2, the gate of PMOS transistor T3 is pulled high, turning off PMOS transistor T3. Inverter 132 inverts the high signal on line 126 to produce a low NDATA signal on line 136, so the gate of transistor T4 is low, turning off transistor T4. Because transistor T4 is off and transistor T2 is on, boosted output data signal BDATA is at Vcc2. Because transistor T3 is off and transistor T1 is on, boosted complementary output data signal NBDATA is low at Vss.

If DATA is low (i.e., at Vss), the input 134 to inverter 132 is low. Inverter 132 therefore produces a high NDATA signal on output 136. The high signal on line 136 is applied to the gate of NMOS transistor T4, turning transistor T4 on and pulling node N2 to Vss on line 124. With node N2 at Vss, the signal BDATA is low. The low signal on node N2 is applied to the gate of transistor T3, turning transistor T3 on. The gate of transistor T1 is low, so transistor T1 is off. With transistor T3 on and transistor T1 off, the voltage of node N1 and therefore the voltage of complementary boosted output data signal NBDATA is boosted to a high value of Vcc2. Because N1 is high, transistor T2 is off.

The boosting (level shifting) circuitry 120 of FIG. 7 may be used to boost logic signals on an integrated circuit in any suitable location. With one particularly suitable arrangement, boosting circuitry of the type shown in FIG. 7 is used to boost the signals associated with the inputs to a look-up table. The look-up table may be located on any suitable integrated circuit. For example, the look-up table may be located within the logic element (LE) of a programmable logic device integrated circuit such as device 10 of FIG. 1.

To conserve device resources, it may be desirable to implement the boosting circuit 120 using transistors that provide additional functions in a programmable logic circuit. For example, an inverter such as inverter 114 of FIG. 6 may be associated with CMOS pass gates for multiplexers in a look-up table. Inverters such as inverter 114 may be implemented by connecting a PMOS transistor and NMOS transistor in series between a positive power supply terminal and a ground terminal. To reduce duplication of transistors, an inverter such as inverter 114 of FIG. 6 may be implemented using transistors such as transistors T3 and T1 of FIG. 7 (which form an inverter). Similarly, level recovery circuitry (e.g., level recovery circuitry such as level recovery circuitry 54 of FIG. 4) may have an inverter (e.g., an inverter such as inverter 64 of FIG. 4) for each logic signal path. In programmable logic device integrated circuits that use logic element input matrix (LEIM) level recovery circuits with inverters, the inversion function of the LEIM inverter can be used to perform the inversion functions of inverter 132 of FIG. 7 (i.e., inverter 132 of FIG. 7 can be implemented using an LEIM level recovery circuit inverter). In situations such as these, only two additional transistors are needed to form each boosting circuit 120 (i.e., transistors T2 and T4 of FIG. 7).

Figure 8:
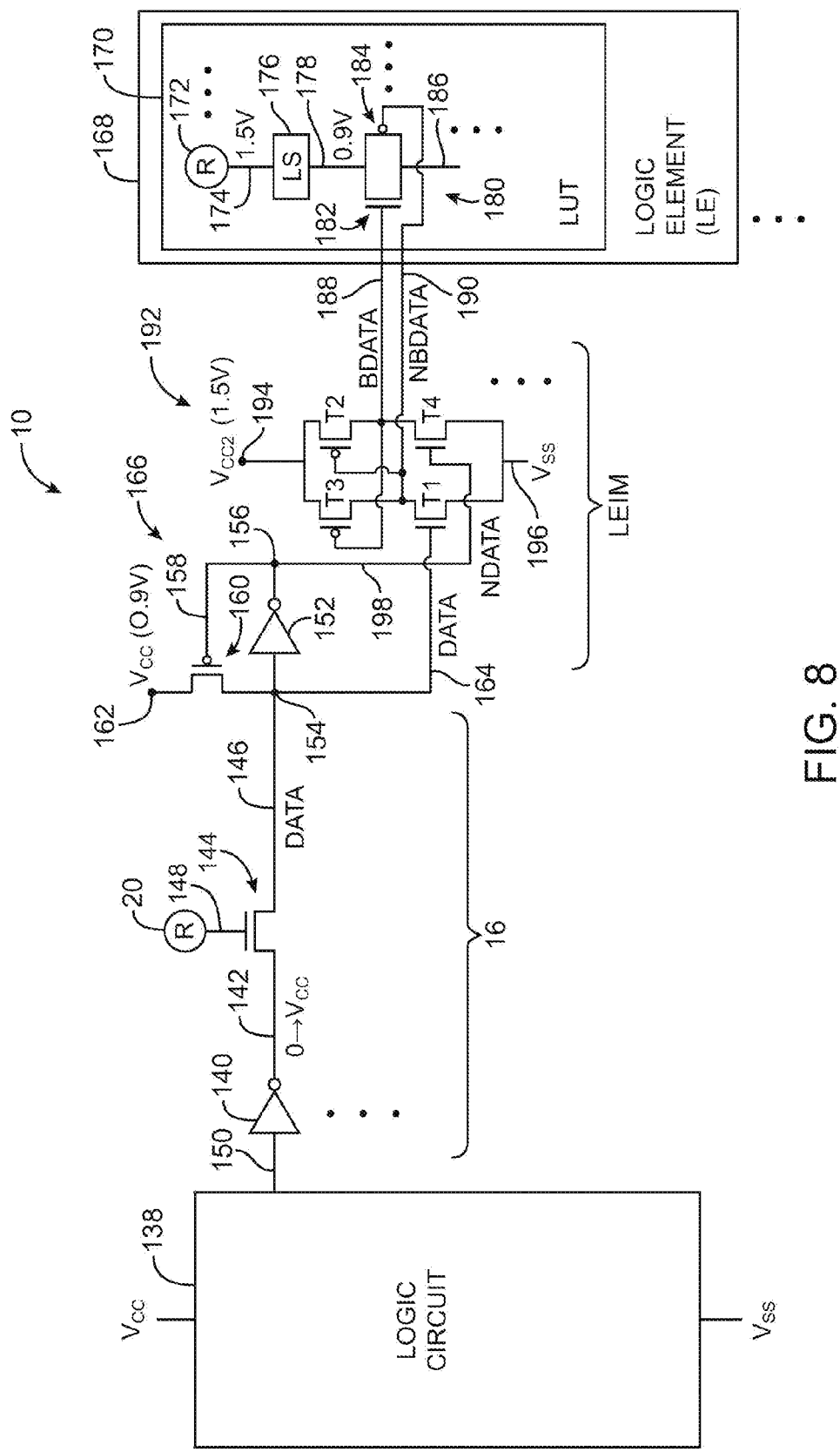
FIG. 8 is a circuit diagram of an illustrative integrated circuit such as a programmable logic device integrated circuit in which data signals from a logic circuit are routed through pass gates and interconnect lines to a logic element input matrix and logic element look-up table having associated look-up table input signal boosting circuitry in accordance with an embodiment of the present invention.

An illustrative boosting circuit arrangement that may be used to boost logic element input signals before they are applied to CMOS pass gates (e.g., in a look-up table) is shown in FIG. 8. As shown in FIG. 8, programmable logic device integrated circuit 10 may have a logic circuit 138 that produces data signals at its outputs such as output 150. Logic circuit 138 may, for example, contain a plurality of logic elements (LEs), each of which produces a signal for a corresponding output line 150.

The logic circuit 138 may be associated with the core logic of programmable logic device integrated circuit 10 and may be powered using a core logic positive power supply voltage Vcc and a ground voltage Vss. As an example, logic circuitry 138 may be powered using a Vcc value of 0.9 volts and a ground voltage Vss of 0 volts. Other values of Vcc (and, if desired, multiple core power supply levels) may be used. The use of a Vcc value of 0.9 volts is merely illustrative.

The output signals from logic circuit 138 may be driven onto interconnects 16. Interconnects 16 may contain any suitable number of interconnect line segments and any suitable number of programmable switches. In the example of FIG. 8, inverter 140 is used to drive data signal DATA onto a first line segment 142 and a second line segment 146. The programmable nature of the interconnect paths in interconnects 16 is represented schematically by the presence of a single illustrative pass transistor 144. In general, there may be any suitable number of programmable multiplexers or other programmable routing switches in interconnects 16. Each multiplexer or other such switching circuitry may be formed from multiple transistors such as transistor 144, from CMOS pass gates, from programmable fuses or antifuses, or any other suitable configurable element or path.

Conductive line segments such as segments 142 and 146 may be used to form interconnect paths between the output of one logic circuit (e.g., circuit 138) and the input of another logic circuit (e.g., circuit 138 itself or a separate logic circuit). In the example of FIG. 8, the logic circuit into which the output signals from logic circuit 138 are routed is shown as logic element 168. Logic element 168 may be, for example, one of a plurality of logic elements in a larger region of programmable logic such as a logic array block (LAB).

The signal that is driven onto interconnect line 142 by inverter 140 ranges between Vss (for logic lows) and Vcc (for logic highs). The state of switching circuits such as pass transistor 144 may be controlled by associated programmable elements 20 (e.g., CRAM cells). In the example of FIG. 8, a programmable element 20 is shown as applying a control signal to pass transistor 144 via a control line 148. The output of programmable element 20 may be provided at any suitable voltage. For example, the output of programmable element 20 may be at Vcc (e.g., 0.9 volts, may be at a voltage that is elevated with respect to Vcc (e.g., 1.5 volts) or may be any other suitable voltage. In programmable logic device integrated circuits in which the CRAM cells are powered at elevated power supply voltages, some of the CRAM cells may produce elevated outputs at one voltage and other CRAM cells may produce elevated outputs at another voltage. To reduce complexity, it may be desirable for all CRAM cells to produce an output voltage at the same elevated voltage (e.g., a positive power supply voltage Vcc2 of 1.5 volts).

When the programmable elements 20 in interconnects 16 are loaded with configuration data, the multiplexer circuitry in interconnects 16 is configured to route signals to their desired destinations. Programmable elements 20 that are loaded with logic zeros produce signals of Vss at their outputs and therefore turn off their associated re-channel pass transistors such as transistors 144. Programmable elements that are loaded with logic ones produce signals of 1.5 volts (Vcc2), thereby turning on their associated programmable interconnect transistors 144.

When transistors such as transistor 144 are turned on, data signals such as signal DATA are allowed to pass from the output of drivers such as inverter 140 to the inputs of the logic elements 168 or other logic circuitry on device 10. Circuitry that is immediately adjacent to the inputs of logic elements such as logic element 168 is sometimes referred to as logic element input matrix (LEIM) circuitry.

As shown in FIG. 8, the LEIM circuitry of device 10 may include a level recovery circuit 166 and a boosting (level shifting) circuit 192. The LEIM circuitry of device 10 may include level recovery circuitry that is formed of numerous level recovery circuits 166, each of which is associated with a respective interconnect line. The LEIM circuitry of device 10 may also include boosting circuitry that is formed from numerous boosting circuits such as circuit 192, each of which is associated with a respective interconnect line. The operation of a single input path, a single level recovery circuit, a single boosting circuit, and a single pass gate in a single look-up table 172 in a single logic element 168 is described for clarity.

Level recovery circuit 166 may have a PMOS transistor 160 having its gate connected to node 156 via feedback path 158. An inverter 152 may be connected between node 154 and node 156. Inverter 152 may be implemented by connecting a PMOS transistor and an NMOS transistor in series between positive power supply voltage Vcc and ground voltage Vss (as an example).

Inverter 152 inverts the signal DATA that is presented on node 154 and produces an inverted version of the signal (NDATA) on node 156. When the signal DATA on line 146 and node 154 is rising (i.e., when driver 140 is attempting to drive a logic high signal onto the interconnects 16), inverter 152 takes the signal on node 156 to Vss. This turns on PMOS transistor 160. PMOS transistor 160 is connected in series between power supply voltage Vcc at terminal 162 and node 154. When PMOS transistor 160 is turned on, node 154 is pulled high to Vcc. This increases the speed at which line 146 and node 154 rise to Vcc and thereby increases the speed at which data can be driven onto interconnect paths such as interconnect segments 142 and 146.

Path 164 provides the signal DATA to the gate of transistor T1, whereas path 198 provides the signal NDATA from node 156 to the gate of transistor T4. Booster circuit 192 is powered using a positive power supply voltage Vcc2 (e.g., 1.5 volts) that is elevated with respect to the power supply voltage Vcc (e.g., 0.9 volts) that is used for logic circuit 138 and that is associated with the signal swing on path 146. Unboosted data signal DATA is boosted by circuit 192 to produce boosted data signal BDATA on path 188. Unboosted inverted data signal NDATA is boosted by circuit 192 to produce boosted inverted data signal NBDATA on path 190.

When signal DATA is high, transistor T1 is on. This pulls NBDATA low to Vss at terminal 196 and pulls the gate of transistor T2 low. With the gate of transistor T2 low, transistor T2 turns on, pulling BDATA on path 188 to Vcc2 on terminal 194. The high signal BDATA turns off transistor T3. The low signal NDATA on line 198 turns transistor T4 off. In this situation, a BDATA signal of Vcc2 is applied to the input of logic element 168 via logic element input 188 and an NBDATA signal of Vss is applied to the input of logic element 168 via input line 190.

When signal DATA is low, signal NDATA is high. The low DATA signal at the gate of transistor T1 turns transistor T1 off. The high NDATA signal on the gate of transistor T4 turns transistor T4 on and pulls signal BDATA to Vss at line 196. With BDATA low, transistor T3 is turned on and signal NBDATA is pulled high to Vcc2 at terminal 194. The high value of NBDATA on the gate of transistor T2 turns transistor T2 off. In this situation, a BDATA signal of Vss is applied to the input of logic element 168 and an NBDATA signal of Vcc2 is applied to the input of logic element 168.

The data signal DATA that is transmitted from logic circuit 138 through interconnects 16 is received by a logic circuit that contains logic element 168. Logic element 168 may contain logic such as look-up table 170. Lines 188 and 190 may serve as inputs to the logic element 168 and look-up table 170. Programmable elements 172 (e.g., CRAM cells loaded with configuration data or other programmable elements such as programmable elements 20 of FIG. 1) may be used to store entries for look-up table 170. Look-up table 170 may have any suitable number of inputs and any suitable number of associated programmable elements 172. For example, each look-up table 170 may have four inputs and $2^4$ associated entries in corresponding cells 172.

The output signals from CRAM cells 172 may be determined by the values of the configuration bits that are stored in CRAM cells 172. For example, if a CRAM cell in a look-up table 170 contains a logic zero, the output of that CRAM cell 172 may be Vss. If a CRAM cell in look-up table 170 contains a logic one, the output of that CRAM cell may be Vcc2 (e.g., 1.5 volts) or other suitable power supply voltage. A level shifter such as level shifter 176 may be used to alter the voltage from each CRAM cell 172. For example, a level shifter such as level shifter 176 may receive a voltage of Vcc2 on input 174 and may produce a corresponding voltage of Vcc (e.g., 0.9 volts) on output 178.

Look-up table 170 may contain switching circuitry such as multiplexers 86 of FIG. 5. Multiplexers 86 may be formed from CMOS pass gates such as CMOS pass gate 180. Only a single CMOS pass gate is shown in the look-up table 170 of FIG. 8 to avoid over-complicating the drawing.

CMOS pass gate 180 may have an NMOS transistor 182 and a PMOS transistor 184. Transistors 182 and 184 may be connected in parallel between CMOS pass gate input 178 and CMOS pass gate output 186. The signals BDATA and NDATA may be used as control signals for the multiplexers of look-up table 170. For example, the signal BDATA may be applied to the gate of transistor 182 from look-up table input line 188. The signal NBDATA, which represents an inverted version of BDATA, may be applied to the gate of PMOS transistor 184 via look-up table input 190.

During operation of device 10, logic circuit 138 produces output signals. These output signals are routed to the inputs of other logic circuits over interconnects 16. In particular, these logic signals are routed to the inputs of look-up tables such as look-up table 170. Level recovery circuitry such as level recovery circuit 166 strengthens the signals and thereby helps to ensure that the signals on the interconnects switch rapidly. The level recovery circuitry may include inverter circuitry that produces an inverted version of each data signal. Boosting circuitry such as boosting circuitry 192 increases the maximum voltage of the data signals and produces true and complementary boosted versions of each unboosted data signal. These boosted signals (BDATA and NBDATA) are applied to the control inputs of CMOS pass gates in look-up table 170. Because BDATA and NBDATA have elevated voltages with respect to regular unboosted data signals DATA and NDATA, the NMOS and PMOS transistors in the CMOS pass gate are turned on more fully than if unboosted signals were used as control signals. This ensures that the CMOS pass gates and the look-up table that contains the CMOS pass gates can switch more rapidly than would otherwise be possible.

The foregoing is merely illustrative of the principles of this invention and various modifications can be made by those skilled in the art without departing from the scope and spirit of the invention.

What is claimed is:

1. An integrated circuit comprising:
    a logic circuit that produces unboosted data signals;
    at least one interconnect path that receives the unboosted data signals, wherein the unboosted data signals have an associated maximum voltage level;
    a look-up table having a plurality of look-up table input lines; and
    level shifting circuitry that receives the unboosted data signals and that boosts the unboosted data signals to produce boosted data signals that have an associated maximum voltage level that is greater than the maximum voltage level of the unboosted data signals, wherein the boosted data signals are applied to the look-up table input lines by the level shifting circuitry, wherein the look-up table comprises:
        a plurality of programmable elements, each of which stores a look-up table entry and produces a static control signal; and
        a plurality of level shifters, each of which is directly connected to a respective one of the programmable elements and reduces the voltage level of the static control signal produced by that programmable element to a voltage level that is less than the maximum voltage level of the boosted data signals that are applied to the look-up table input lines.

2. The integrated circuit defined in claim 1 wherein the look-up table comprises at least one complementary metal-oxide-semiconductor pass gate and wherein at least one of the boosted data signals is applied to a control input associated with the complementary metal-oxide-semiconductor pass gate.

3. The integrated circuit defined in claim 1 wherein:
the look-up table comprises at least one complementary metal-oxide-semiconductor pass gate;
the complementary metal-oxide-semiconductor pass gate has an n-channel transistor with a transistor gate and a p-channel transistor with a transistor gate; and
the level shifting circuitry applies at least one of the boosted data signals to at least one of the transistor gates.

4. The integrated circuit defined in claim 1 wherein:
the look-up table comprises at least one complementary metal-oxide-semiconductor pass gate;
the complementary metal-oxide-semiconductor pass gate has an n-channel transistor with a transistor gate and a p-channel transistor with a transistor gate;
the level shifting circuitry applies at least a given one of the boosted data signals to the transistor gate of the n-channel transistor; and
the level shifting circuitry has at least one output with which a complementary version of the given one of the boosted data signals is applied to the transistor gate of the p-channel transistor.

5. The integrated circuit defined in claim 1 further comprising a level recovery circuit connected to the interconnect path.

6. The integrated circuit defined in claim 1 further comprising a level recovery circuit coupled between the interconnect path and the level shifting circuitry, wherein the level recovery circuit comprises an inverter.

7. The integrated circuit defined in claim 1 further comprising a level recovery circuit that has a p-channel metal-oxide semiconductor transistor and an inverter, wherein the inverter receives at least a given one of the unboosted data signals and produces a corresponding inverted unboosted data signal and wherein the level shifting circuitry receives the given one of the unboosted data signals and the inverted unboosted data signal from the level recovery circuit.

8. The integrated circuit defined in claim 1 further comprising a level recovery circuit that has a p-channel metal-oxide semiconductor transistor and an inverter, wherein the inverter receives the at least a given one of the unboosted data signals and produces a corresponding inverted unboosted data signal, wherein the level shifting circuitry receives the given one of the unboosted data signals and the inverted unboosted data signal from the level recovery circuit, and wherein the p-channel metal-oxide semiconductor transistor has a gate that receives the inverted unboosted data signal from the inverter.

9. Circuitry comprising:
an interconnect path that carries a first data signal having a first associated maximum voltage level;
a level recovery circuit that includes a p-channel metal-oxide-semiconductor transistor that is connected between a positive power supply terminal and the interconnect path, wherein the p-channel metal-oxide-semiconductor transistor has a gate, wherein the level recovery circuit has an inverter that receives the first data signal and that produces a corresponding inverted version of the first data signal, and wherein the inverted version of the first data signal is provided to the gate of the p-channel metal-oxide-semiconductor transistor;
a programmable look-up table containing at least one complementary-metal-oxide-semiconductor pass gate having control inputs; and
level shifting circuitry that receives the first data signal and the inverted version of the first data signal from the level recovery circuit, wherein the level shifting circuitry has a first output at which a boosted version of the first data signal is provided and has a second output at which a boosted version of the inverted version of the first data signal is provided, wherein the first output and the second output are connected to the control inputs of the complementary-metal-oxide-semiconductor pass gate, and wherein the complementary-metal-oxide-semiconductor pass gate includes an n-channel transistor having an n-channel transistor gate and a p-channel transistor having a p-channel transistor gate.

10. The circuitry defined in claim 9 wherein the first output of the level shifting circuitry is coupled to the n-channel transistor gate and wherein the second output of the level shifting circuitry is coupled to the p-channel transistor gate.

11. An integrated circuit comprising:
interconnects over which data signals are transmitted, wherein the data signals have an associated maximum voltage level;
look-up table circuitry with a plurality of data inputs; and
input circuitry that is coupled between the interconnects and the data inputs, wherein the input circuitry includes level shifting circuitry that boosts a voltage level of the data signals and that applies corresponding boosted versions of the data signals to the data inputs, wherein the boosted versions of the data signals have an associated maximum voltage level that is greater than the maximum voltage level of the data signals and wherein the look-up table circuitry comprises:
a plurality of programmable elements, each of which stores a look-up table entry and produces a static control signal; and
a plurality of level shifters, each of which is directly connected to a respective one of the programmable elements and reduces the voltage level of the static control signal produced by that programmable element to a voltage level that is less than the maximum voltage level of the boosted versions of the data signals that are applied to the data inputs of the look-up table circuitry.

12. The integrated circuit defined in claim 11 wherein the interconnects comprise:
pass transistors through which the data signals flow; and
random-access-memory cells that produce static control signals to control the pass transistors, wherein the static control signals are elevated in voltage with respect to the voltage level of the data signals.

13. The integrated circuit defined in claim 11 further comprising a plurality of logic elements, wherein the look-up table circuitry comprises a plurality of look-up tables, each of which is associated with a respective one of the plurality of logic elements.

14. The integrated circuit defined in claim 11 further comprising level recovery circuitry in the input circuitry, wherein the level recovery circuitry includes inverters that invert the data signals before the data signals are boosted by the level shifter circuitry.

15. The integrated circuit defined in claim 11 further comprising level recovery circuitry in the input circuitry, wherein the level recovery circuitry comprises:
- inverters that invert the data signals before the data signals are boosted by the level shifter circuitry; and
- transistors, each of which is connected between a positive power supply and a respective one of the interconnects and each of which has a gate that is connected to an output of a respective one of the inverters.

16. The integrated circuit defined in claim 11 wherein the level shifting circuitry comprises:
- first and second inputs at which true and inverted versions of the data signals from the interconnects are received; and
- first and second boosted signal outputs at which true and inverted boosted versions of the data signals are provided.

17. The integrated circuit defined in claim 11 wherein the look-up table circuitry comprises a plurality of complementary metal-oxide-semiconductor pass gates and wherein the level shifting circuitry provides the boosted versions of the data signals to the complementary metal-oxide-semiconductor pass gates as control signals.

18. The integrated circuit defined in claim 11 wherein the level shifting circuitry comprises:
- first and second inputs at which true and inverted versions of data signals from the interconnects are received; and
- first and second boosted signal outputs at which true and inverted boosted versions of the data signals are provided, wherein the look-up table circuitry comprises a plurality of complementary metal-oxide-semiconductor pass gates and wherein the level shifting circuitry provides the boosted versions of the data signals to the complementary metal-oxide-semiconductor pass gates through the first and second boosted signal outputs.

* * * * *